(12) United States Patent
Han et al.

(10) Patent No.: US 11,444,060 B2
(45) Date of Patent: Sep. 13, 2022

(54) SEMICONDUCTOR PACKAGE

(71) Applicant: Samsung Electronics Co., Ltd., Suwon-si (KR)

(72) Inventors: Sanguk Han, Asan-si (KR); Chajea Jo, Yongin-si (KR); Hyoeun Kim, Cheonan-si (KR); Sunkyoung Seo, Cheonan-si (KR)

(73) Assignee: SAMSUNG ELECTRONICS CO., LTD.

( * ) Notice: Subject to any disclaimer, the term of this patent is extended or adjusted under 35 U.S.C. 154(b) by 133 days.

(21) Appl. No.: 16/742,341

(22) Filed: Jan. 14, 2020

(65) Prior Publication Data

US 2021/0013181 A1   Jan. 14, 2021

(30) Foreign Application Priority Data

Jul. 11, 2019 (KR) .................. 10-2019-0083953

(51) Int. Cl.
*H01L 25/065* (2006.01)
*H01L 23/00* (2006.01)
*H01L 23/31* (2006.01)

(52) U.S. Cl.
CPC ...... *H01L 25/0657* (2013.01); *H01L 23/3121* (2013.01); *H01L 23/3135* (2013.01); *H01L 24/13* (2013.01)

(58) Field of Classification Search
None
See application file for complete search history.

(56) References Cited

U.S. PATENT DOCUMENTS

| 7,732,328 | B2 | 6/2010 | Kwon et al. |
| 8,237,257 | B2 | 8/2012 | Yang |
| 8,742,583 | B2 | 6/2014 | Lin et al. |
| 8,890,329 | B2 | 11/2014 | Kim et al. |
| 8,975,732 | B2 | 3/2015 | Tojo et al. |
| 9,064,862 | B2 | 6/2015 | Hwang et al. |
| 9,111,870 | B2 | 8/2015 | Vincent |
| 9,502,380 | B2 | 11/2016 | Lin et al. |
| 10,051,742 | B2 | 8/2018 | Yang et al. |
| 10,141,286 | B2 * | 11/2018 | Lee ............ H01L 23/3114 |
| 10,256,179 | B2 | 4/2019 | Lin |
| 11,011,502 | B2 * | 5/2021 | Lee ............ H01L 23/3135 |

(Continued)

FOREIGN PATENT DOCUMENTS

CN    202394958 U    8/2012

*Primary Examiner* — Long Pham
(74) *Attorney, Agent, or Firm* — Myers Bigel, P.A.

(57) ABSTRACT

A package-on-package type package includes a lower semiconductor package and an upper semiconductor package. The lower semiconductor package includes a first semiconductor device including a through electrode, a second semiconductor device disposed on the first semiconductor device and including a second through electrode electrically connected to the first through electrode, a first molding member covering a sidewall of at least one of the first semiconductor device and the second semiconductor device, a second molding member covering a sidewall of the first molding member, and an upper redistribution layer disposed on the second semiconductor device and electrically connected to the second through electrode.

20 Claims, 24 Drawing Sheets

(56) References Cited

U.S. PATENT DOCUMENTS

| | | | |
|---|---|---|---|
| 2015/0303174 A1* | 10/2015 | Yu ..................... | H01L 21/6835 |
| | | | 257/712 |
| 2017/0345807 A1* | 11/2017 | Yu ......................... | H01L 24/20 |
| 2018/0005984 A1* | 1/2018 | Yu ......................... | H01L 24/03 |
| 2018/0130746 A1* | 5/2018 | Oganesian ............. | H01L 24/19 |
| 2018/0190590 A1 | 7/2018 | Ma et al. | |
| 2018/0374822 A1* | 12/2018 | Yu ..................... | H01L 23/49816 |
| 2019/0006316 A1* | 1/2019 | Yu ......................... | H01L 25/105 |
| 2019/0096797 A1 | 3/2019 | Lin | |
| 2019/0123019 A1 | 4/2019 | Yu et al. | |
| 2021/0005591 A1* | 1/2021 | Liao ..................... | G02B 6/1226 |
| 2021/0005594 A1* | 1/2021 | Yu ......................... | H01L 25/0657 |
| 2021/0118859 A1* | 4/2021 | Yu ......................... | H01L 21/486 |

\* cited by examiner

US 11,444,060 B2

SEMICONDUCTOR PACKAGE

CROSS-REFERENCE TO RELATED APPLICATION

This application claims priority under 35 U.S.C. § 119 to Korean Patent Application No. 10-2019-0083953, filed on Jul. 11, 2019, in the Korean Intellectual Property Office, the disclosure of which is hereby incorporated by reference in its entirety.

TECHNICAL FIELD

Example embodiments of the present disclosure relate to a semiconductor package, and, more specifically, to a package-on-package type semiconductor package including a lower semiconductor package and an upper semiconductor package.

DISCUSSION OF RELATED ART

A storage capacity of a semiconductor device increases and a semiconductor package including the semiconductor device becomes thin and light. Semiconductor devices with various functions and high speed operation has been implemented in the semiconductor package.

According to a recent trend, a package-on-package type semiconductor package in which an upper semiconductor package is stacked on a lower semiconductor package has been implemented. More specifically, a package in which an upper semiconductor package is stably mounted on a lower semiconductor package or a package in which an upper semiconductor package is electrically connected to a substrate has been provided.

SUMMARY

According to example embodiments of the inventive concepts, a semiconductor package may include a lower semiconductor package and an upper semiconductor package disposed on the lower semiconductor package. The lower semiconductor package may include a circuit substrate, a first semiconductor device disposed on the circuit substrate and including a first through electrode, a second semiconductor device disposed on the first semiconductor device and including a second through electrode electrically connected to the first through electrode, a first molding member covering a sidewall of at least one of the first semiconductor device and the second semiconductor device, a second molding member covering a sidewall of the first molding member, and an upper redistribution layer disposed on the second semiconductor device and electrically connected to the second through electrode. The upper semiconductor package may include a third semiconductor device, and a connection terminal electrically connected to the third semiconductor device and the upper redistribution layer.

According to example embodiments of the inventive concepts, a semiconductor package may include a lower package, and an upper package disposed on the lower package. The lower package may include a first semiconductor device including a first through electrode, a second semiconductor device disposed on the first semiconductor device and including a second through electrode electrically connected to the first through electrode, a first molding member covering a sidewall of at least one of the first semiconductor device and the second semiconductor device, a second molding member covering a sidewall of the first molding member, an upper redistribution layer disposed on the second semiconductor device and electrically connected to the second through electrode, a lower redistribution layer disposed below the first semiconductor device and electrically connected to the first through electrode, and an external connection terminal electrically connected to the lower redistribution layer. The upper semiconductor package may include a third semiconductor device, and a first connection terminal electrically connected to the third semiconductor device and the upper redistribution layer.

According to example embodiments of the inventive concepts, a semiconductor package may include a first semiconductor device including a first through electrode, a second semiconductor device disposed on the first semiconductor device and including a second through electrode electrically connected to the first through electrode, a first molding member covering a sidewall of at least one of the first semiconductor device and the second semiconductor device, an upper redistribution layer disposed on the second semiconductor device and including an upper redistribution pattern electrically connected to the second through electrode, and a third semiconductor device disposed on the upper redistribution layer and electrically connected to the upper redistribution pattern.

DETAILED DESCRIPTION

Figure 1:
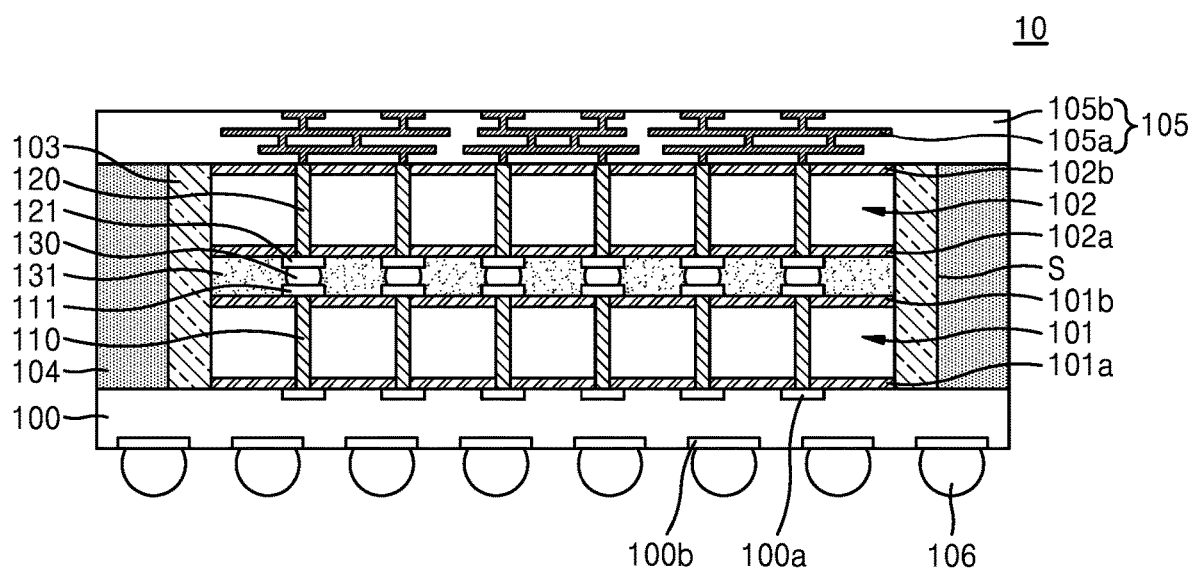
FIG. 1 is a cross-sectional view illustrating a lower semiconductor package of a package-on-package type semiconductor package according to example embodiments of the inventive concept.

Various example embodiments will now be described more fully hereinafter with reference to the accompanying drawings. Like reference numerals may refer to like elements throughout this application.

FIG. 1 is a cross-sectional view illustrating a semiconductor package according to example embodiments of the inventive concept. A semiconductor package 10 may be a lower package of a package-on-package type semiconductor package 20 shown in FIG. 2

Referring to FIG. 1, the semiconductor package 10 may include a circuit substrate 100, a first semiconductor device 101 including a first through electrode 110, a second semiconductor device 102 including a second through electrode 120, a first molding member 103, a second molding member 104, an upper redistribution layer 105, and an external connection terminal 106.

In some embodiments, the circuit substrate 100 may include any of a wafer, a carrier, a printed circuit board (PCB). The circuit substrate 100 may include an upper substrate pad 100a and a lower substrate pad 100b. The upper substrate pad 100a may be electrically connected to the first through electrode 110 of the first semiconductor device 101. The lower substrate pad 100b may be electrically connected to the external connection terminal 106. In addition, the upper substrate pad 100a and the lower substrate pad 100b may be electrically connected by wiring layers in the circuit substrate 100.

In some embodiments, the first semiconductor device 101 may include a memory semiconductor device. The memory semiconductor device may include a volatile memory device, such as a dynamic random access memory (DRAM) or a static random access memory (SRAM), or a nonvolatile memory device, such as a phase change random access memory (PRAM), a magneto-resistive random access memory (MRAM), a ferroelectric random access memory (FeRAM), or a resistive random access memory (RRAM).

In addition, the first semiconductor device 101 may include a logic semiconductor device, such as a central processor unit (CPU), a micro processor unit (MPU), a graphic processor unit (GPU), or an application processor (AP).

In some embodiments, the first semiconductor device 101 may include a first semiconductor device layer 101a, the first through electrode 110, a first protection layer 101b, and a first pad 111. The first semiconductor device layer 101a may be disposed at a lower portion of the first semiconductor device 101. The first semiconductor device layer 101a may include various types of individual devices, for example, a metal oxide semiconductor field effect transistor (MOSFET), such as a complementary metal oxide semiconductor (CMOS) transistor, an image sensor, such as a CMOS image sensor, a system large scale integration (LSI), a micro-electro-mechanical system (MEMS), an active device, or a passive device.

In some embodiments, the first through electrode 110 may passing through the first semiconductor device 101 (i.e., may extend from an upper surface of the first semiconductor device 101 to a lower surface of the first semiconductor device 101). The first through electrode 110 may have a pillar shape, and may include a buried conductive layer and a barrier layer covering a sidewall of the buried conductive layer. The first through electrode 110 may extend into the first semiconductor device layer 101a, and the buried conductive layer of the first through electrode 110 may be electrically connected to the first semiconductor device layer 101a.

In some embodiments, the first protection layer 101b may be disposed at an upper portion of the first semiconductor device 101, and may surround a sidewall of an upper portion of the first through electrode 110. The first protection layer 101b may be, for example, an insulating polymer layer, but is not limited thereto. The first protection layer 101b may include various insulating materials.

In some embodiments, the first pad 111 may be disposed on the first protection layer 101b. The first pad 111 may be electrically connected to the first through electrode 110 exposed by the first protection layer 101b. The first pad 111 may be electrically connected to a second pad 121 of the second semiconductor device 102, and thus the first semiconductor device 101 may be electrically connected to the second semiconductor device 102.

In some embodiments, the second semiconductor device 102 may include a second semiconductor device layer 102a, the second through electrode 120, a second protection layer 102b, and the second pad 121. Since the second semiconductor device layer 102a, the second through electrode 120, and the second pad 121 of the second semiconductor device 102 may have the same structures as the first semiconductor device layer 101a, the first through electrode 110, and the first pad 111, respectively, of the first semiconductor device 101, detailed descriptions thereof may be omitted.

In some embodiments, the semiconductor package 10 may include a connection bump 130 between the first pad 111 and the second pad 121. The connection bump 130 may be a conductive bump for electrically connecting the first semiconductor device 101 and the second semiconductor device 102. The connection bump 130 may include at least one of aluminum (Al), copper (Cu), nickel (Ni), tungsten (W), platinum (Pt), and gold (Au).

In some embodiments, the semiconductor package 10 may be disposed between the first semiconductor device 101 and the second semiconductor device 102, and may include a connection layer 131 covering the first pad 111, the second pad 121, and the connection bump 130. The connection layer 131 may include a nonconductive film (NCF), for example, an insulating polymer. The connection layer 131 may serve to firmly attach the second semiconductor device 102 to the first semiconductor device 101.

In some embodiments, the semiconductor package 10 may be a system-in-system package (SIP) in which different types of semiconductor devices are electrically connected to each other and operate as one system. For example, the first semiconductor device 101 may be a memory semiconductor device, and the second semiconductor device 102 may be a logic semiconductor device configured to control the first semiconductor device 101. However, the inventive concept is not limited thereto. The first semiconductor device 101 and the second semiconductor device 102 may be semiconductor devices of the same type.

In some embodiments, the first molding member 103 may cover a sidewall of at least one of the first semiconductor device 101 and the second semiconductor device 102. The first molding member 103 may be configured to firmly attach the second semiconductor device 102 to the first semiconductor device 101. For example, the first molding member 103 may cover sidewalls of all the first semiconductor device 101 and the second semiconductor device 102. In some embodiments, the first molding member 103 may cover any one of sidewalls of the first semiconductor device 101 and the second semiconductor device 102.

In some embodiments, the first molding member 103 may include an underfill material including at least one of an insulating material and an epoxy resin. For example, the first molding member 103 may include an epoxy molding compound (EMC).

In some embodiments, the second molding member 104 may be disposed on the circuit substrate 100, and may cover a sidewall (or an outer sidewall) of the first molding member 103. By the second molding member 104, the first semiconductor device 101 and the second semiconductor device 102 may be firmly fixed to the circuit substrate 100. The second molding member 104 may include an underfill material including at least one of an insulating polymer and an epoxy resin. A sidewall (or an outer sidewall) of the second molding member 104 may be aligned with a sidewall of the semiconductor package 10 (or with a sidewall of the circuit substrate 100)

In some embodiments, a material of the first molding member 103 and a material of the second molding member 104 may be different. Thus, viscosity, stiffness, and flexibility of the first molding member 103 may be different from those of the second molding member 104.

In some embodiments, the first molding member 103 and the second molding member 104 may share an interfacial surface S. More specifically, the interfacial surface S may be a contact surface between the first molding member 103 and the second molding member 104. The interfacial surface S may extend from an upper surface of the circuit substrate 100 to a lower surface of the upper redistribution layer 105. The interfacial surface S may extend in a vertical direction perpendicular to the upper surface of the circuit substrate 100.

In some embodiments, an upper surface of the second through electrode 120 of the semiconductor package 10, an upper surface of the first molding member 103, and an upper surface of the second molding member 104 may be coplanar with one another. The upper surface of the second through electrode 120 may contact a lower surface of the upper redistribution layer 105. More specifically, the upper surface of the second through electrode 120 may contact an upper redistribution pattern 105a of the upper redistribution layer 105.

In some embodiments, the upper redistribution layer 105 may be disposed on the second semiconductor device 102. The upper redistribution layer 105 may cover an upper surface of the second semiconductor device 102, the upper surface of the first molding member 103, and the upper surface of the second molding member 104. A sidewall of the upper redistribution layer 105 may be aligned with a sidewall of the semiconductor package 10 (or with a sidewall of the second molding member 104).

In some embodiments, the upper redistribution layer 105 may include an upper redistribution pattern 105a and an upper insulation pattern 105b. The upper redistribution pattern 105a may be electrically connected to the second through electrode 120 of the second semiconductor device 102. The upper redistribution pattern 105a may provide an electrical connection path for electrically connecting the first and second semiconductor devices 101 and 102 to a third semiconductor device (see 151 of FIG. 2). An upper insulation pattern 105b may cover the upper redistribution pattern 105a. The upper insulation pattern 105b may protect the upper redistribution pattern 105a from an external impact, and may prevent electrical short of the upper redistribution pattern 105a. The upper insulation pattern 105b may include at least one of silicon oxide, silicon nitride, and polymer. For example, the upper insulation pattern 105b may include epoxy or polyimide.

In some embodiments, when viewed in a top-down view, the upper redistribution pattern 105a of the upper redistribution layer 105 may be exposed to the outside. A connection terminal (see 152 of FIG. 2) of an upper semiconductor package (see 15 of FIG. 2) may be mounted on the upper redistribution layer 105, and may be electrically connected to the upper redistribution pattern 105a.

Since the semiconductor package 10 includes the first semiconductor device 101 including the first through electrode 110, the second semiconductor device 102 including the second through electrode 120, and the upper redistribution layer 105 electrically connected to the second through electrode 120, the third semiconductor device (see 151 of FIG. 2) may be easily mounted on the semiconductor package 10. In addition, the third semiconductor device (see 151 of FIG. 2) may be electrically connected to the circuit substrate 100 through the upper redistribution layer 105, the second through electrode 120, and the first through electrode 110.

Since the semiconductor package 10 includes the upper redistribution layer 105 on the second semiconductor device 102, the first molding member 103 and the second molding member 104 may not include a through electrode for electrically connecting the third semiconductor device (see 151 of FIG. 2) to the circuit substrate 100. Thus, the first molding member 103 and the second molding member 104 may occupy a small area on the circuit substrate 100, and a size of the semiconductor package 10 may be reduced. As the size of the semiconductor package 10 is reduced, productivity of the semiconductor package 10 may increase.

Figure 2:
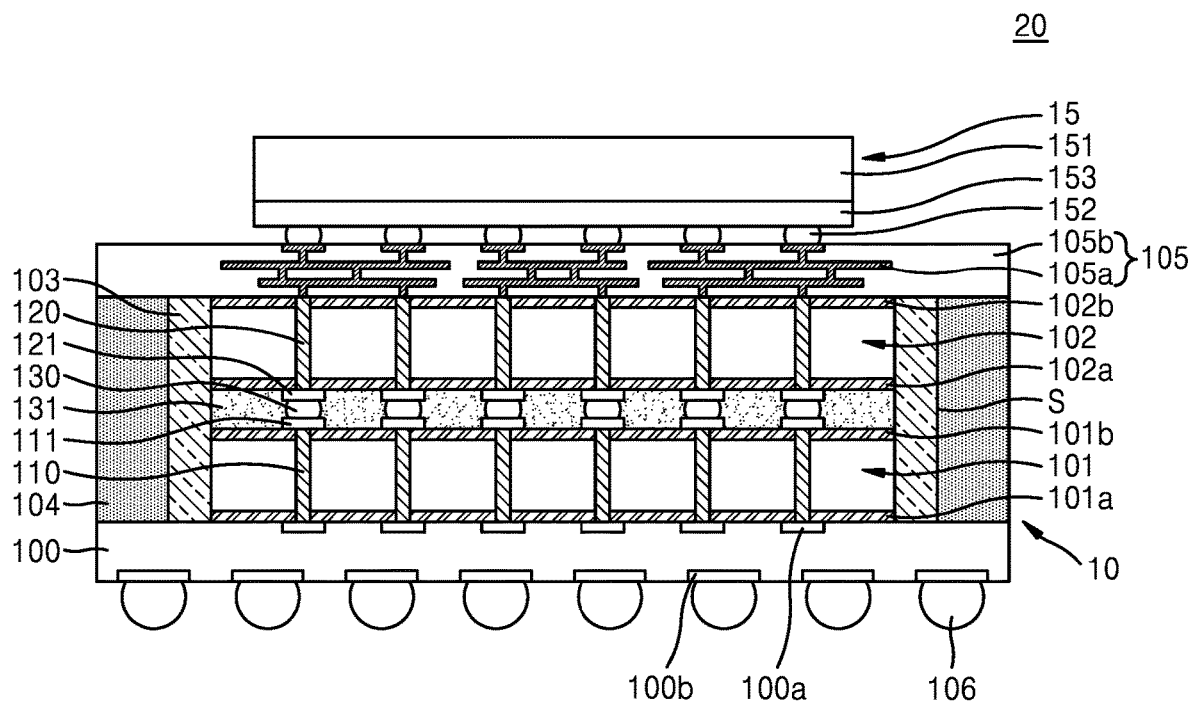
FIGS. 2, 3 and 4 are cross-sectional views illustrating a package-on-package type semiconductor package according to example embodiments of the inventive concept.

FIG. 2 is a cross-sectional view illustrating a semiconductor package according to example embodiments of the inventive concept.

Referring to FIG. 2, the semiconductor package 20 may be a package-on-package type semiconductor package including the lower semiconductor package 10 and the upper semiconductor package 15.

In some embodiments, the lower semiconductor package 10 may include substantially the same elements as the semiconductor package 10 described with reference to FIG. 1.

In some embodiments, the upper semiconductor package 15 may be mounted on the lower semiconductor package 10. More specifically, the upper semiconductor package 15 may be mounted on the upper redistribution layer 105 of the lower semiconductor package 10, and may be electrically connected to the upper redistribution pattern 105a of the upper redistribution layer 105. In addition, as shown in FIG. 2, a sidewall of the upper semiconductor package 15 may be positioned further inward than a sidewall of the second molding member 104.

In some embodiments, the upper semiconductor package 15 may include the third semiconductor device 151 and the connection terminal 152. The third semiconductor device 151 may be a similar to the first semiconductor device 101 and the second semiconductor device 102.

In some embodiments, a width of the third semiconductor device 151 may be less than a width of the upper redistribution layer 105. In some embodiments, a width of the third semiconductor device 151 may be substantially the same as a width of the upper redistribution layer 105. In some embodiments, a width of the third semiconductor device 151 may be less than a width of the second semiconductor device 102. In some embodiments, a width of the third semiconductor device 151 may be greater than a width of the second semiconductor device 102.

In some embodiments, the connection terminal 152 may electrically connect the third semiconductor device 151 of the upper semiconductor package 15 to the upper redistribution layer 105 of the lower semiconductor package 10. More specifically, the connection terminal 152 may be electrically connected to the upper redistribution pattern 105a of the upper redistribution layer 105.

In some embodiments, the upper semiconductor package 15 may further include a substrate 153 between the third semiconductor device 151 and the connection terminal 152. The substrate 153 may be any of a wafer, a carrier, and a PCB on which a redistribution layer is formed. The substrate 153 may electrically connect the third semiconductor device 151 and the connection terminal 152.

The third semiconductor device 151 of the upper semiconductor package 15 may be electrically connected to the circuit substrate 100 through the substrate 153, the connection terminal 152, the upper redistribution layer 105, the second through electrode 120, the first through electrode 110.

The lower semiconductor package 10 of the semiconductor package 20 may include the upper redistribution layer 105 on the second semiconductor device 102, and the upper redistribution pattern 105a of the upper redistribution layer 105 may be exposed to the outside. Thus, an electrical connection between the connection terminal 152 of the upper semiconductor package 15 and the upper redistribution layer 105 of the lower semiconductor package 10 may be easily made.

Since the first molding member 103 and the second molding member 104 of the semiconductor package 20 does not include the through electrode for electrically connecting the third semiconductor device 151 to the circuit substrate 100, the first molding member 103 and the second molding member 104 may occupy a small area on the circuit substrate 100. Thus, when the size of the semiconductor package 20 is reduced, productivity of the semiconductor package 20 may increase.

Figure 3:
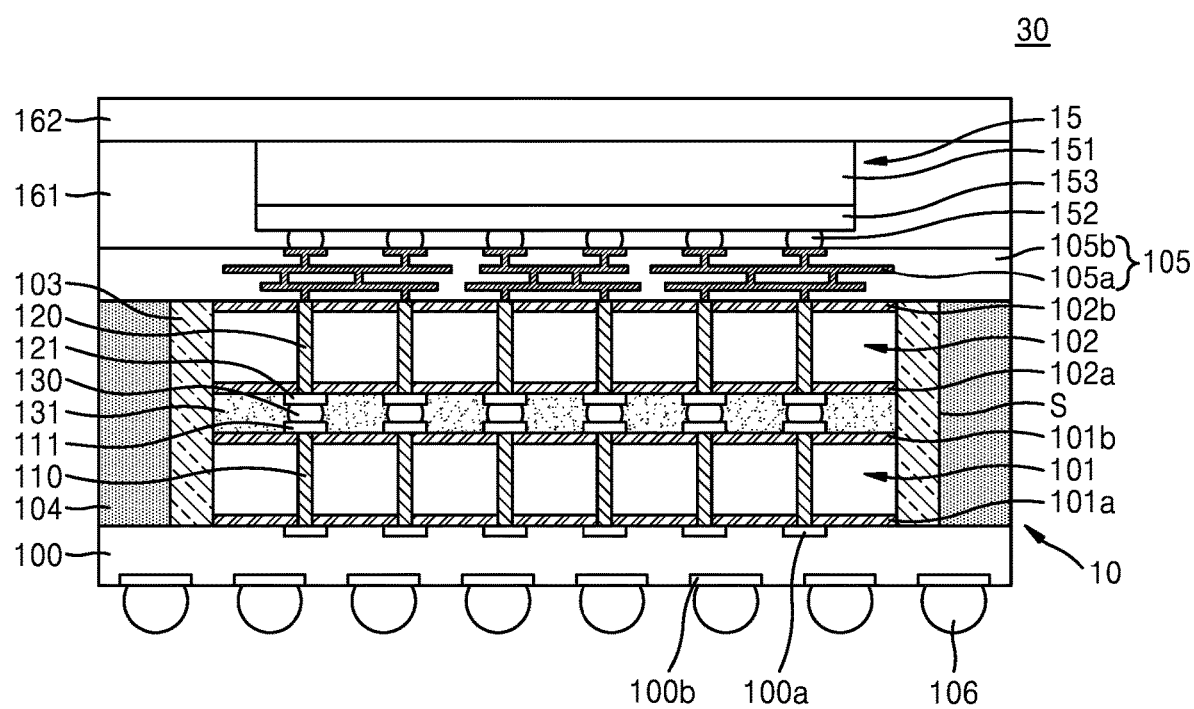

FIG. 3 is a cross-sectional view illustrating a semiconductor package according to example embodiments of the inventive concept.

A semiconductor package 30 may be a package-on-package type semiconductor package including the lower semiconductor package 10 and the upper semiconductor package 15. The lower semiconductor package 10 and the upper semiconductor package 15 may be substantially the same elements as the semiconductor packages 10 and 15 described with reference to FIGS. 1 and 2.

Referring to FIG. 3, the upper semiconductor package 15 may further include a third molding member 161 and a heat sink 162. In some embodiments, the third molding member 161 may cover a sidewall of the third semiconductor device 151. The third molding member 161 may serve to firmly fix the third semiconductor device 151 to the upper redistribution layer 105. In addition, a sidewall of the third molding member 161 may be aligned with a sidewall of the lower semiconductor package 10.

In some embodiments, the heat sink 162 may be mounted on the third semiconductor device 151. The heat sink 162 may serve to release heat generated from the semiconductor package 30 to the outside. The heat sink 162 may include metal having an excellent thermal conductivity. The heat sink 162 may include at least one of aluminum (Al), nickel (Ni), copper (Cu), magnesium (Mg), and silver (Ag).

In some embodiments, the heat sink 162 may be disposed on the third semiconductor device 151 by an adhesive film. The adhesive film may have its own adhesive characteristics. The adhesive film may have a double-sided adhesive film.

In some embodiments, the third molding member 161 may cover the sidewall of the third semiconductor device 151, but may not cover an upper surface of the third semiconductor device 151. In some embodiments, the third molding member 161 may cover the upper surface and the sidewall of the third semiconductor device 151.

Since the semiconductor package 30 includes the third molding member 161, a structural stability of the semiconductor package 30 may increase. Accordingly, the semiconductor package 30 may have a low risk of damage from an external shock. Since the semiconductor package 30 includes the heat sink 162, the semiconductor package 30 may have an excellent heat dissipation performance.

Figure 4:
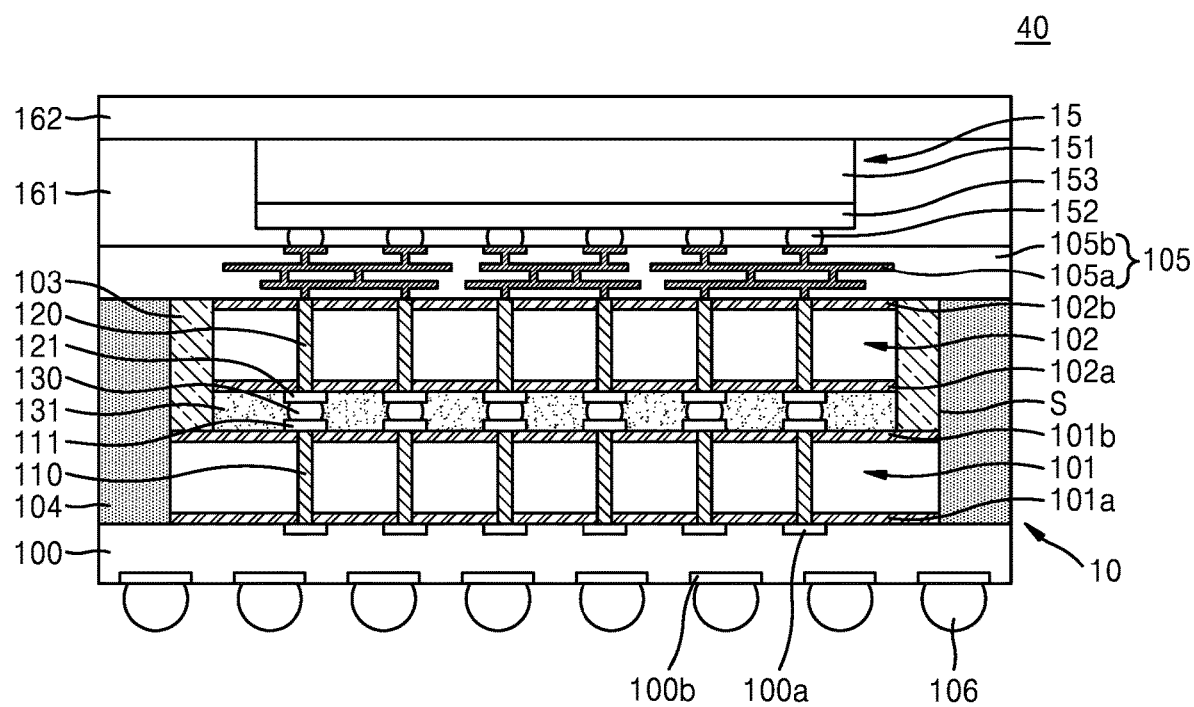

FIG. 4 is a cross-sectional view illustrating a semiconductor package according to example embodiments of the inventive concept.

Referring to FIG. 4, a semiconductor package 40 may be a package-on-package type semiconductor package including the lower semiconductor package 10 and the upper semiconductor package 15. The lower semiconductor package 10 and the upper semiconductor package 15 may include the same elements as the semiconductor package 30 described with reference to FIG. 3.

FIG. 4, in the lower semiconductor package 10, a size of the first semiconductor device 101 and a size of the second semiconductor device 102 may be different. For example, the size of the first semiconductor device 101 may be greater than the size of the second semiconductor device 102. In other words, a width of the first semiconductor device 101 may be greater than a width of the second semiconductor device 102. Thus, a sidewall of the second semiconductor device 102 may be positioned further inward than a sidewall of the first semiconductor device 101.

In some embodiments, the first molding member 103 may be disposed on the first semiconductor device 101. More specifically, the first molding member 103 may be cover the sidewall of the second semiconductor device 102. A sidewall (or an outer sidewall) of the first molding member 103 may be aligned with the sidewall of the first semiconductor device 101.

In some embodiments, the second molding member 104 may be disposed on the circuit substrate 100, and may cover the sidewall of the first molding member 103 and the sidewall of the first semiconductor device 101. The second molding member 104 may contact the sidewall of the first molding member 103 and the sidewall of the first semiconductor device 101.

Figure 5:
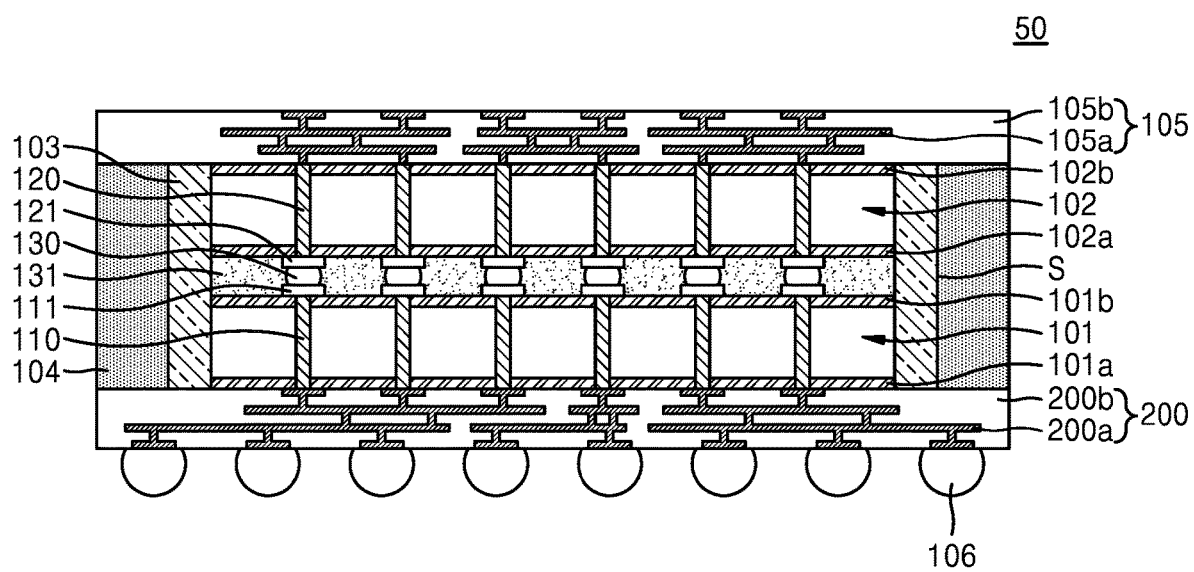
FIG. 5 is a cross-sectional view illustrating a lower semiconductor package of a package-on-package type semiconductor package according to example embodiments of the inventive concept.
Figure 6:
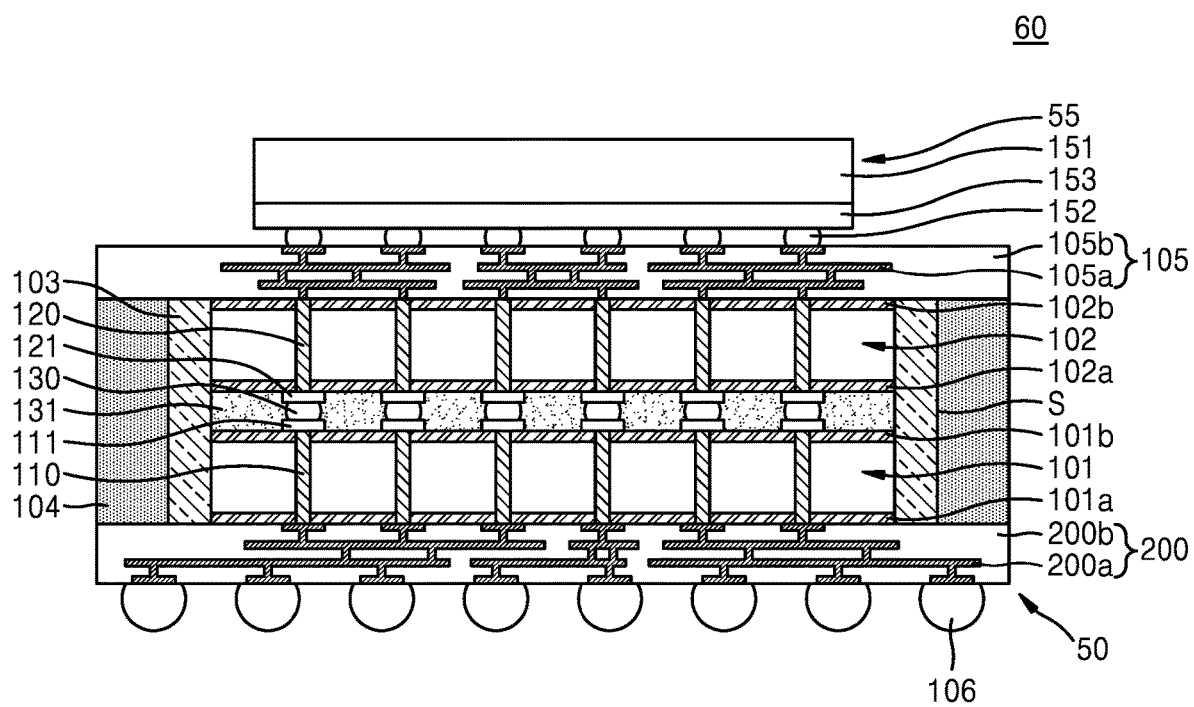
FIGS. 6, 7, 8 are cross-sectional views illustrating a package-on-package type semiconductor package according to example embodiments of the inventive concept.

FIG. 5 is a cross-sectional view illustrating a semiconductor package according to example embodiments of the inventive concept. A semiconductor package 50 may be a lower package of a package-on-package type semiconductor package 60 as shown in FIG. 6.

Referring to FIG. 5, the semiconductor package 50 may include the first semiconductor device 101 including the first through electrode 110, the second semiconductor device 102 including the second through electrode 120, the first molding member 103, the second molding member 104, the upper redistribution layer 105, a lower redistribution layer 200, and the external connection terminal 106.

In some embodiments, the first semiconductor device 101 including the first through electrode 110, the second semiconductor device 102 including the second through electrode 120, the first molding member 103, the second molding member 104, the upper redistribution layer 105, and the external connection terminal 106 may be the same as those described with reference to FIGS. 1 to 3.

In some embodiments, the semiconductor package 50 may include the lower redistribution layer 200, and the lower redistribution layer 200 may be disposed below the first semiconductor device 101. An upper surface of the lower redistribution layer 200 may contact a lower surface of the first semiconductor device 101, and lower surfaces of the first and second molding members 103 and 104. A sidewall of the lower redistribution layer 200 may be aligned with a sidewall of the semiconductor package 50 (or with a sidewall of the second molding layer 104).

In some embodiments, the lower redistribution layer 200 may include a lower redistribution pattern 200a and a lower insulation pattern 200b. The lower redistribution pattern 200a may be electrically connected to the first through electrode 110 of the first semiconductor device 101. The lower redistribution pattern 200a may provide an electrical connection path for electrically connecting the first and second semiconductor devices 101 and 102 to the external connection terminal 106. The lower insulation pattern 200b may cover the lower redistribution pattern 200a. The lower insulation pattern 200b may protect the lower redistribution pattern 200a from the external impact, and may prevent the electrical short of the lower redistribution pattern 200a. The lower insulation pattern 200b may include at least one of silicon oxide, silicon nitride, and polymer. For example, the lower insulation pattern 200b may include epoxy or polyimide.

Since the semiconductor package 50 includes the first semiconductor device 101 including the first through electrode 110, the second semiconductor device 102 including the second through electrode 120, and the upper redistribution layer 105 electrically connected to the second through electrode 120, the third semiconductor device (see 151 of FIG. 6) may be easily mounted on the semiconductor package 50. In addition, the third semiconductor device (see 151 of FIG. 6) may be electrically connected to the lower redistribution layer 200 through the upper redistribution layer 105, the second through electrode 120, and the first through electrode 110.

Since the semiconductor package 50 includes the upper redistribution layer 105 on the second semiconductor device 102, the first molding member 103 and the second molding member 104 of the semiconductor package 50 may not include a through electrode for connecting the third semiconductor device (see 151 of FIG. 6) to the lower redistribution layer 200. Thus, the first molding member 103 and the second molding member 104 may occupy a small area on the lower redistribution layer 200, and a size of the semiconductor package 50 may be reduced. As the size of the semiconductor package 50 is reduced, productivity of the semiconductor package 50 may increase.

FIG. 6 is a cross-sectional view illustrating a semiconductor package according to example embodiments of the inventive concept.

A semiconductor package 60 may be a package-on-package type semiconductor package including the lower semiconductor package 50 and an upper semiconductor package 55.

In some embodiments, the lower semiconductor package 50 may be the same as described with reference to FIG. 5.

Referring to FIG. 6, the upper semiconductor package 55 may include the third semiconductor device 151, the connection terminal 152, and the substrate 153. The third semiconductor device 151, the connection terminal 152, and the substrate 153 may be the same as described with reference to FIG. 2.

The third semiconductor device 151 of the upper semiconductor package 55 may be electrically connected to the lower redistribution layer 200 through the substrate 153, the connection terminal 152, the upper redistribution layer 105, the second through electrode 120, and the first through electrode 110.

The lower semiconductor package 50 of the semiconductor package 60 may include the upper redistribution layer 105 on the second semiconductor device 102, and the upper redistribution pattern 105a of the upper redistribution layer 105 may be exposed to the outside. Thus, an electrical connection between the connection terminal 152 of the upper semiconductor package 55 and the upper redistribution layer 105 of the lower semiconductor package 50 may be easily made.

Since the first molding member 103 and the second molding member 104 of the semiconductor package 60 do not include a through electrode for electrically connecting the third semiconductor device 151 to the lower redistribution layer 200, the first and second molding members 103 and 104 may occupy a small area on the lower redistribution layer 200. Thus, a size of the semiconductor package 60 may be reduced, and productivity of the semiconductor package 60 may increase.

Figure 7:
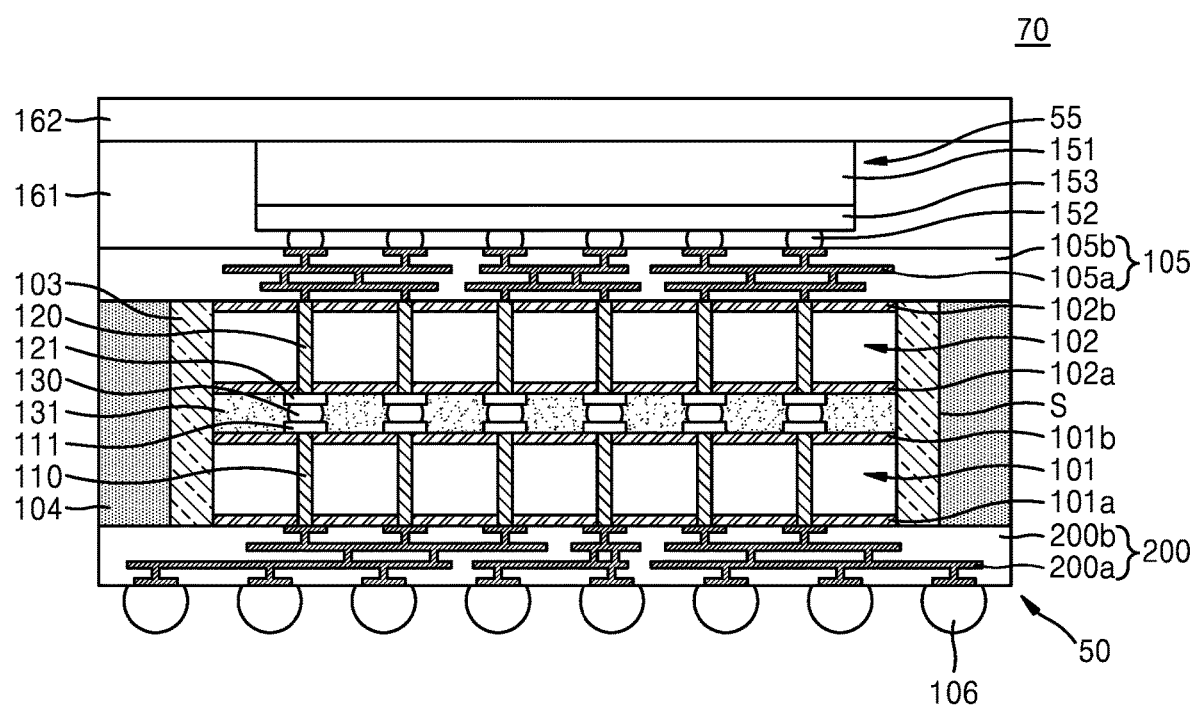

FIG. 7 is a cross-sectional view illustrating a semiconductor package according to example embodiments of the inventive concept.

A semiconductor package 70 may be a package-on-package type semiconductor package including the lower semiconductor package 50 and the upper semiconductor package 55. The upper semiconductor package 55 and the lower semiconductor package 50 may be the same as described with reference to FIGS. 5 and 6.

Referring to FIG. 7, the upper semiconductor package 55 may further include the third molding member 161 and the heat sink 162. The third molding member 161 and the heat sink 162 may be the same as described with reference to FIG. 3.

A sidewall of the heat sink 162 may be positioned further outward than a sidewall of the third semiconductor device 151. A sidewall of the heat sink 162 may be aligned with a sidewall of the semiconductor package 70 (or with a sidewall of the third molding member 161 and a sidewall of the second molding member 104). In some embodiments, the sidewall of the heat sink 162 may be positioned further inward than the sidewall of the semiconductor package 70.

Figure 8:
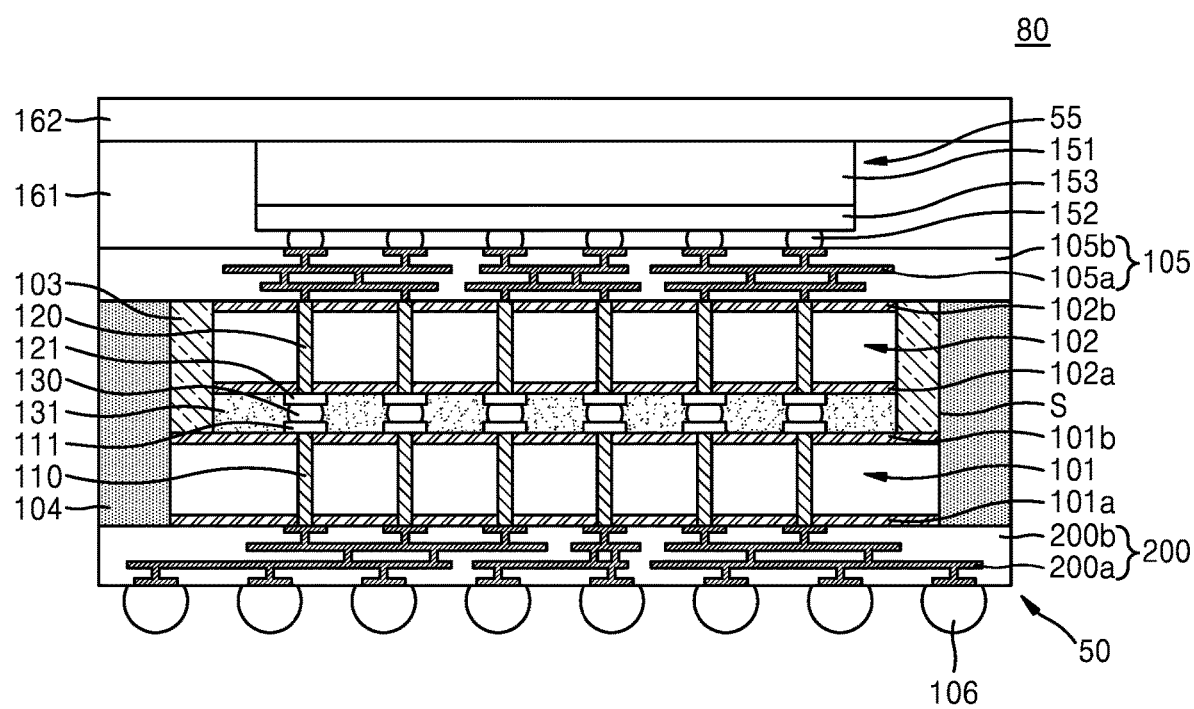

FIG. 8 is a cross-sectional view illustrating a semiconductor package according to example embodiments of the inventive concept.

A semiconductor package 80 may be a package-on-package type semiconductor package including the lower semiconductor package 50 and the upper semiconductor package 55. The upper semiconductor package 55 and the lower semiconductor package 50 may include the same elements as described with reference to FIG. 7.

Referring to FIG. 8, in the lower semiconductor package 50, a size of the first semiconductor device 101 and a size of the second semiconductor device 102 may be different. For example, the size of the first semiconductor device 101 may be greater than a size of the second semiconductor device 102. In other words, a width of the first semiconductor device 101 may be greater than a width of the second semiconductor device 102. Thus, a sidewall of the second semiconductor device 102 may be positioned further inward than a sidewall of the first semiconductor device 101.

In some embodiments, the first molding member 103 may be disposed on the first semiconductor device 101. More specifically, the first molding member 103 may cover a sidewall of the second semiconductor device 102. A sidewall (or an outer sidewall) of the first molding member 103 may be aligned with the sidewall of the first semiconductor device 101.

In some embodiments, the second molding member 104 may be disposed on the lower redistribution layer 200, and may cover the sidewall of the first molding member 103 and the sidewall of the first semiconductor device 101. The second molding member 104 may contact the sidewall of the first molding member 103 and the sidewall of the first semiconductor device 101.

FIGS. 9 to 24 are views illustrating stages in a method of manufacturing a semiconductor package according to example embodiments of the inventive concept. FIGS. 9 to 15 illustrates stages in a method of mounting a second semiconductor device on a first semiconductor device.

Figure 9:
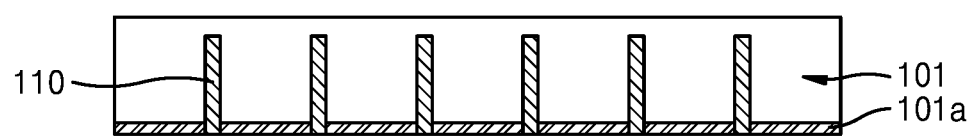
FIGS. 9 to 15 are views illustrating stages in a method of mounting a second semiconductor device on a first semiconductor device according to example embodiments of the inventive concept.

Referring to FIG. 9, the first through electrode 110 may be formed in the first semiconductor device 101. The first semiconductor device 101 may include the first semiconductor device layer 101a. The first through electrode 110 may be formed to extend from the first semiconductor device layer 101a to the inside of the first semiconductor device 101. The first through electrode 110 may have a pillar shape. The first through electrode 110 may include a buried conductive layer and a barrier layer surrounding the buried conductive layer.

Figure 10:
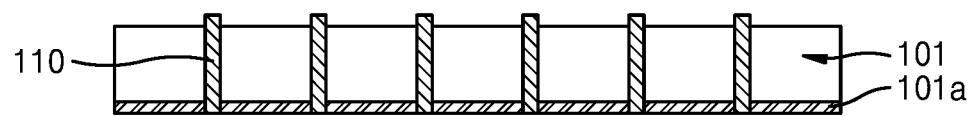

Referring to FIG. 10, a portion of the first through electrode 110 may be exposed to the outside. More specifically, a portion of an upper portion of the first semiconductor device 101 may be etched, and thus the upper portion of the first semiconductor device 101 may be exposed to the outside. Thus, the first through electrode 110 may pass through the first semiconductor device 101. The upper portion of the first semiconductor device 101 may be etched through at least one of a chemical mechanical polishing process (CMP) and an etch back process.

Figure 11:
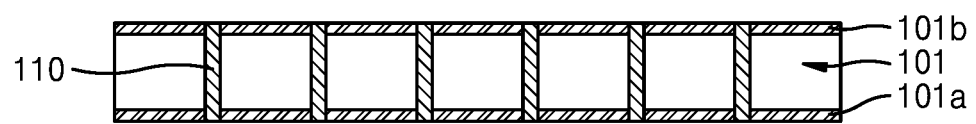

Referring to FIG. 11, the first protection layer 101b may be formed on the first semiconductor device 101. The first protection layer 101b may cover an upper surface of the first semiconductor device 101, and may cover an upper portion of the through electrode 110. In some embodiments, the first protection layer 101b may be formed by at least one of a spin coating process and a spray process. A portion of the first protection layer 101b may be etched to expose an upper surface of the first through electrode 110.

Figure 12:
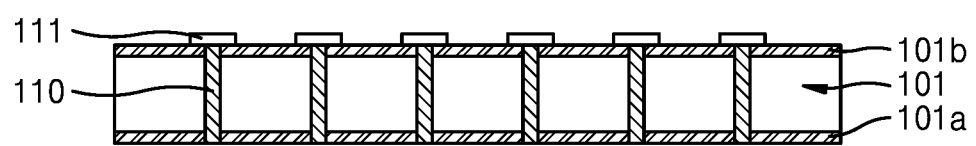

Referring to FIG. 12, the first pad 111 may be attached to the first through electrode 110. The first pad 111 may be disposed on the first protection layer 101b, and may contact the upper surface of the first through electrode 110.

Figure 13:
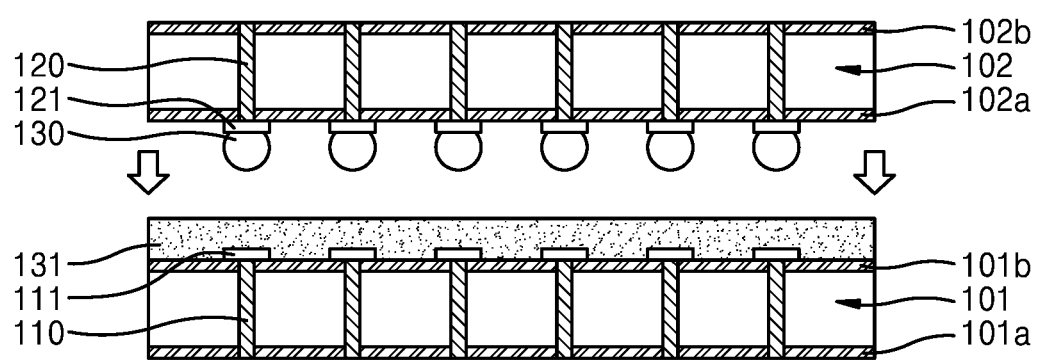

Referring to FIG. 13, the second semiconductor device 102 may be stacked on the first semiconductor device 101. The second semiconductor device 102 may include the second semiconductor device layer 102a, the second through electrode 120, and the second protection layer 102b. A process of forming the second through electrode 120 and the second protection layer 102b of the second semiconductor device 102 may be substantially the same as the process of forming the first through electrode 110 and the first protection layer 101b of the first semiconductor device 101. The second pad 121 may be formed on a lower surface of the second through electrode 120. The connection bump 130 may be formed on a lower surface of the second pad 121.

In some embodiments, the connection layer 131 may be coated on the first semiconductor device 101. After the connection layer 131 is coated on the first semiconductor device 101, the second semiconductor device 102 may be disposed on the first semiconductor device 101. More specifically, the second semiconductor device 102 may be formed on the first semiconductor device layer 101 so that the connection bump 130 of the second semiconductor device 102 is located at a position corresponding to the first pad 111 of the first semiconductor device 101.

In some embodiments, a process of electrically connecting the connection bump 130 of the second semiconductor device 102 and the first pad 111 of the first semiconductor device 101 may be performed. More specifically, the connection bump 130 may be coupled to the first pad 111 by at least one of a reflow process and a thermal compression process.

Figure 14:
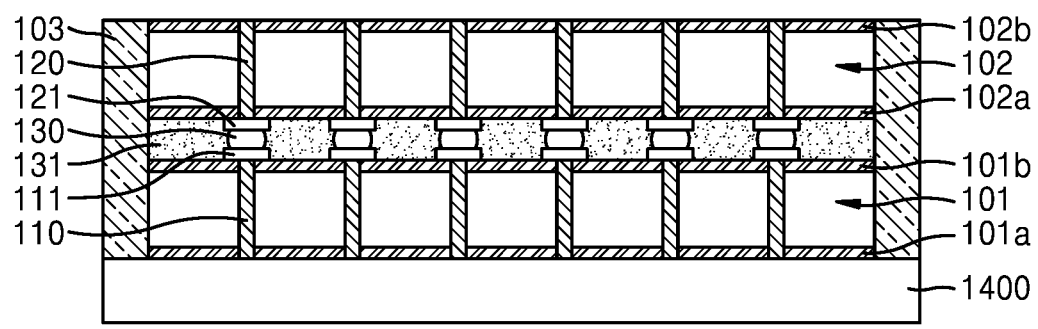

Referring to FIG. 14, the first molding member 103 may be formed. The first molding member 103 may be formed to cover a sidewall of at least one of the first semiconductor device 101 and the second semiconductor device 102. For example, the first molding member 103 may cover sidewalls of the first semiconductor device 101 and the second semiconductor device 102.

In some embodiments, the formation of the first molding member 103 may include forming a first protection substrate 1400 below the first semiconductor device 101. The first protection substrate 1400 may protect the first semiconductor device 101 from an external impact.

Figure 15:
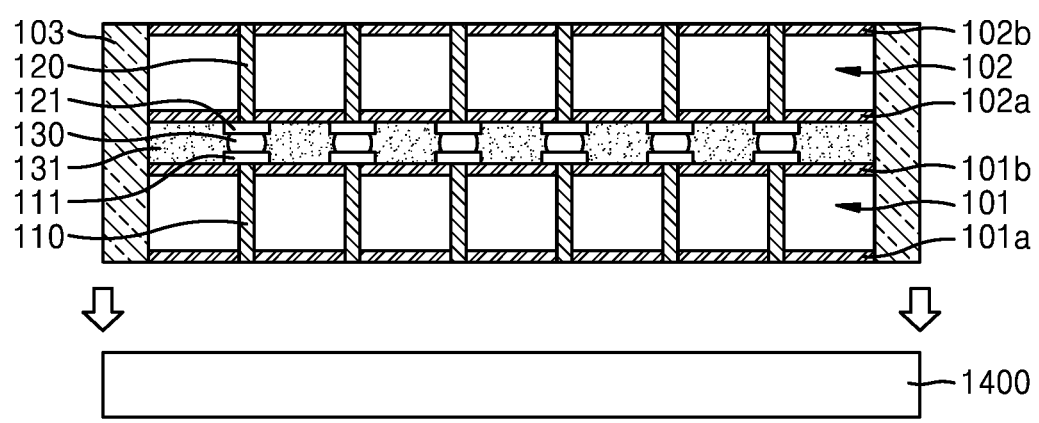

Referring to FIG. 15, the first protection substrate 1400 may be detached from the first semiconductor device 101. In some embodiments, as the first protection substrate 1400 is detached from the first semiconductor device 101, the first and second semiconductor devices 101 and 102 of a stack structure may be formed.

FIGS. 16 to 19 are views illustrating stages in a method of manufacturing a package-on-package type semiconductor package. FIGS. 16 to 19 are views illustrating stages in a method of manufacturing the semiconductor package 30 of FIG. 3

Figure 16:
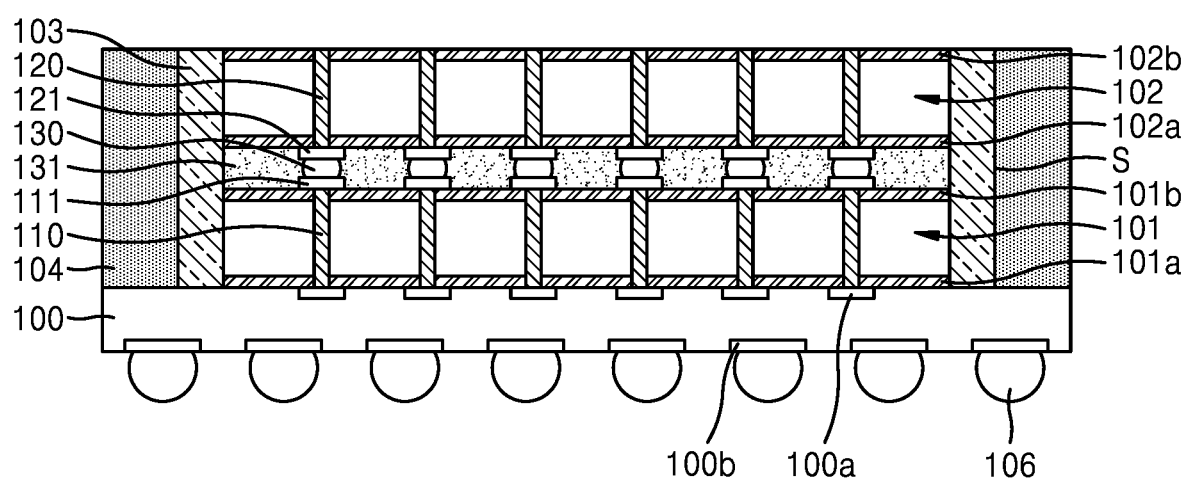
FIGS. 16 to 19 are views illustrating stages in a method of manufacturing a package-on-package type semiconductor package according to example embodiments of the inventive concept.

Referring to FIG. 16, the first and second semiconductor devices 101 and 102 of the stack structure formed through the method described with reference to FIGS. 9 to 15 may be mounted on the circuit substrate 100, and the second molding member 104 may be formed on the circuit substrate 100.

The first and second semiconductor devices 101 and 102 of the stack structure may be mounted on the circuit substrate 100 so that a lower surface of the first through electrode 110 of the first semiconductor device 101 contacts the upper substrate pad 100a of the circuit substrate 100.

In some embodiments, the second molding member 104 may be formed to cover a sidewall of the first molding member 103. The second molding member 104 may serve to firmly couple the first and second semiconductor devices 101 and 102 with the circuit substrate 100.

In some embodiments, after the second molding member 104 is formed, an upper portion of the second molding member 104 may be partly etched. For example, the upper portion of the second molding member 104 may be partly etched so that an upper surface of the second molding member 104 is coplanar with an upper surface of the first molding member 103, an upper surface of the second through electrode 120, and an upper surface of the second protection layer 102b.

Figure 17:
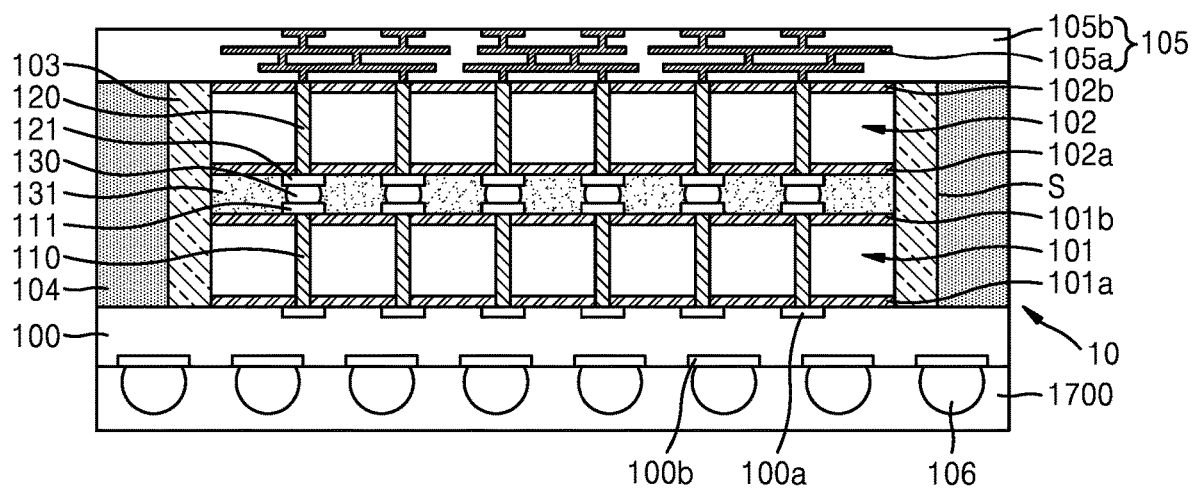

Referring to FIG. 17, the upper redistribution layer 105 may be formed on the second semiconductor device 102. In some embodiments, the formation of the upper redistribution layer 105 may include forming the upper redistribution pattern 105a and the upper insulation pattern 105b on the second semiconductor device 102. The upper redistribution pattern 105a and the upper insulation pattern 105b may be formed by a deposition process, a photolithography process, and an electro-plating process. The upper redistribution pattern 105a may be electrically connected to the second through electrode 120 of the second semiconductor device 102.

In some embodiments, the formation of the upper redistribution layer 105 may include forming a second protection substrate 1700 below the circuit substrate 100. The second protection substrate 1700 may serve to protect the circuit substrate 100 and the external connection terminal 106 from the external impact when the upper redistribution layer 105 is formed.

Figure 18:
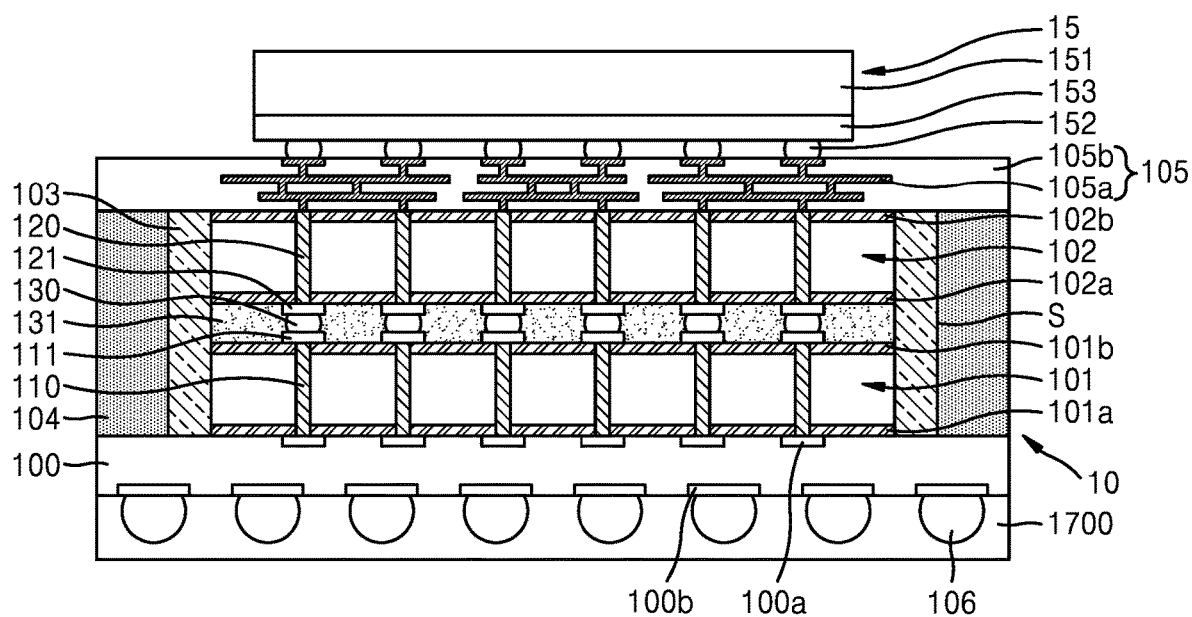

Referring to FIG. 18, the upper semiconductor package 15 may be mounted on the lower semiconductor package 10. In some embodiments, the mounting of the upper semiconductor package 15 on the lower semiconductor package 10 may include mounting the connection terminal 152 of the upper semiconductor package 15 on the upper redistribution layer 105 and electrically connecting the connection terminal 152 to the upper redistribution pattern 105a.

Figure 19:
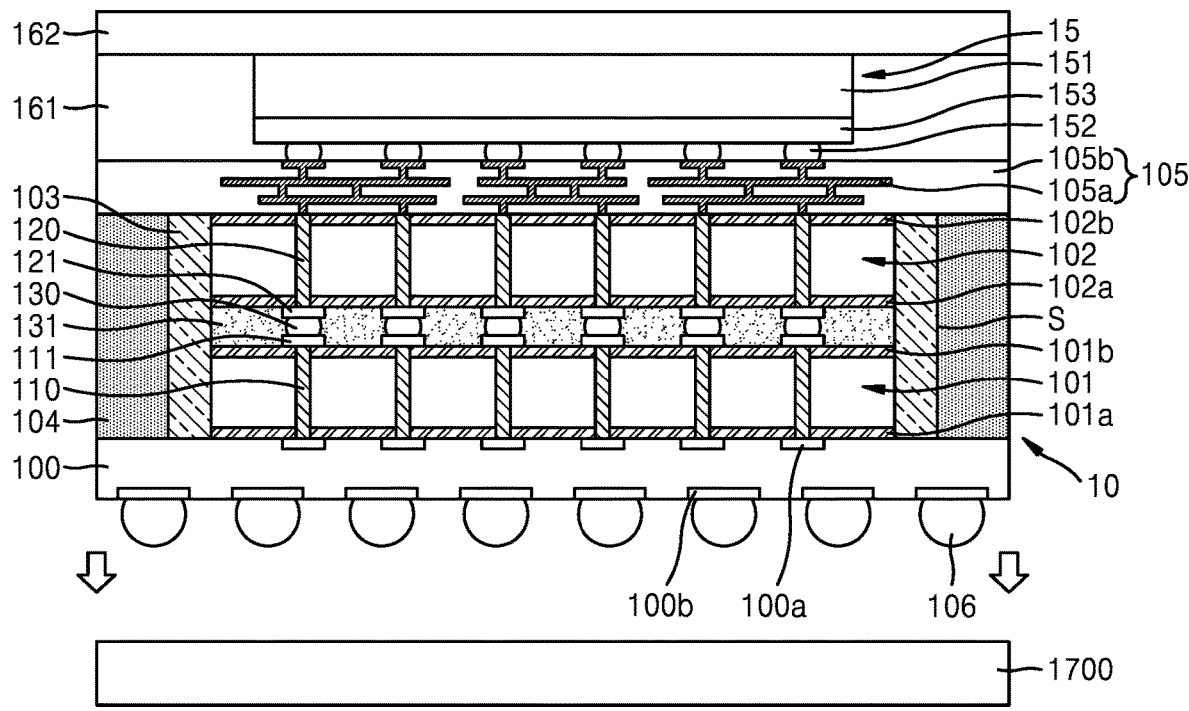

Referring to FIG. 19, the third molding member 161 and the heat sink 162 may be formed. In some embodiments, the third molding member 161 may be formed on the upper redistribution layer 105 to cover a sidewall of the third semiconductor device 151.

In some embodiments, the third molding member 161 may be formed to cover an upper surface and a sidewall of the third semiconductor device 151.

In some embodiments, the formation of the heat sink 162 may be formed by attaching the heat sink 162 to the third semiconductor device 151 through an adhesive film. When the third molding member 161 covers only the sidewall of the third semiconductor device 151, the heat sink 162 may be attached to the upper surface of the third semiconductor device 151. In addition, when the third molding member 161 covers the upper surface and the sidewall of the third semiconductor device 151, the heat sink 162 may be attached to an upper surface of the third molding member 161.

In some embodiments, the second protection substrate 1700 may be detached form the circuit substrate 100. The second protection substrate 1700 may be detached after the third molding member 161 and the heat sink 162 are formed.

FIGS. 20 to 24 are views illustrating stages in a method of manufacturing a package-on-package type semiconductor package. FIGS. 20 to 24 illustrate stages in a method of manufacturing the semiconductor package 70 of FIG. 7.

Figure 20:
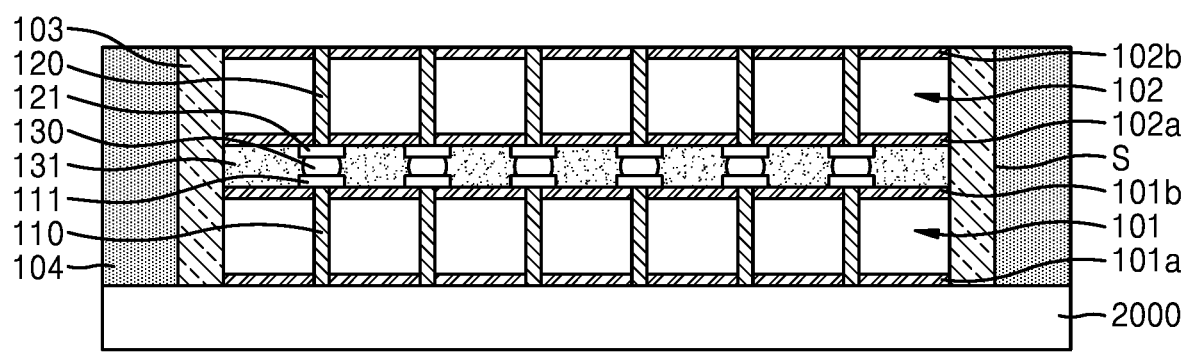
FIGS. 20 to 24 are views illustrating stages in a method of manufacturing a package-on-package type semiconductor package according to example embodiments of the inventive concept.

Referring to FIG. 20, the second molding member 104 may be formed. In some embodiments, the formation of the second molding member 104 may include attaching a third protection substrate 2000 to a lower surface of the first semiconductor device 101. The third protection substrate 2000 may include, for example, a glass substrate.

In some embodiments, the formation of the second molding member 104 may include forming on the third protection substrate 2000 to cover a sidewall of the first molding member 103.

In some embodiments, the formation of the second molding member 104 may include detaching the third protection substrate 2000 from the first molding member 103, the second molding member 104, and the first semiconductor device 101.

Figure 21:
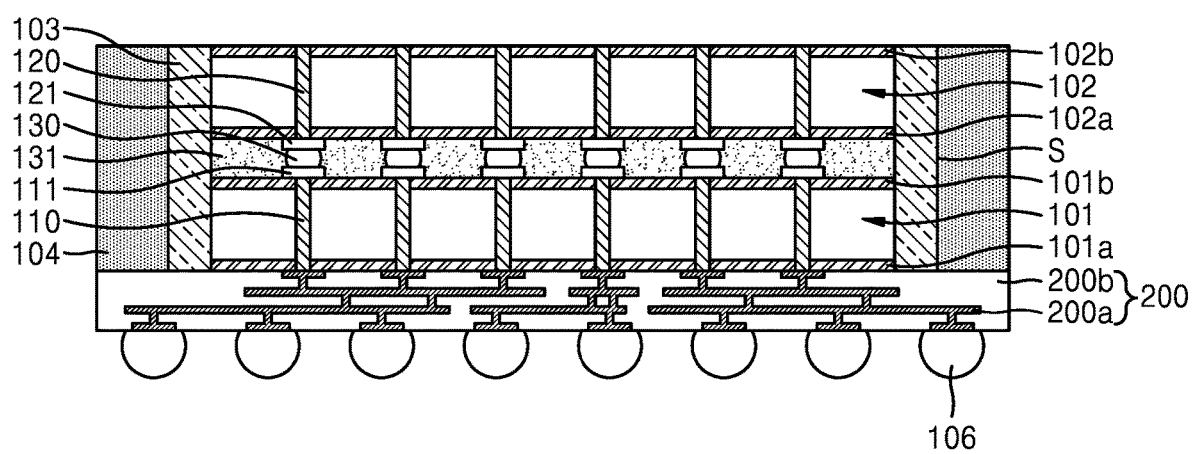

Referring to FIG. 21, the lower redistribution layer 200 and the external connection terminal 106 may be formed. In some embodiments, the formation of the lower redistribution layer 200 may include forming the lower redistribution pattern 200a and the lower insulation pattern 200b below the first semiconductor device 101. The lower redistribution pattern 200a and the lower insulation pattern 200b may be formed by a deposition process, a photolithography process, and an electro-plating process. The lower redistribution pattern 200a may be electrically connected to the first through electrode 110 of the first semiconductor device 101. In addition, the formation of the external connection terminal 106 may include mounting the external connection terminal 106 on the lower redistribution layer 200 and electrically connecting the external connection terminal 106 and the lower redistribution pattern 200a.

In some embodiments, the formation of the second molding member 104 may include, after the first and second semiconductor devices 101 and 102 of a stack structure are mounted on the preformed lower redistribution layer 200, forming the second molding member 104 on the lower redistribution layer 200 to cover a sidewall of the first molding member 103.

Figure 22:
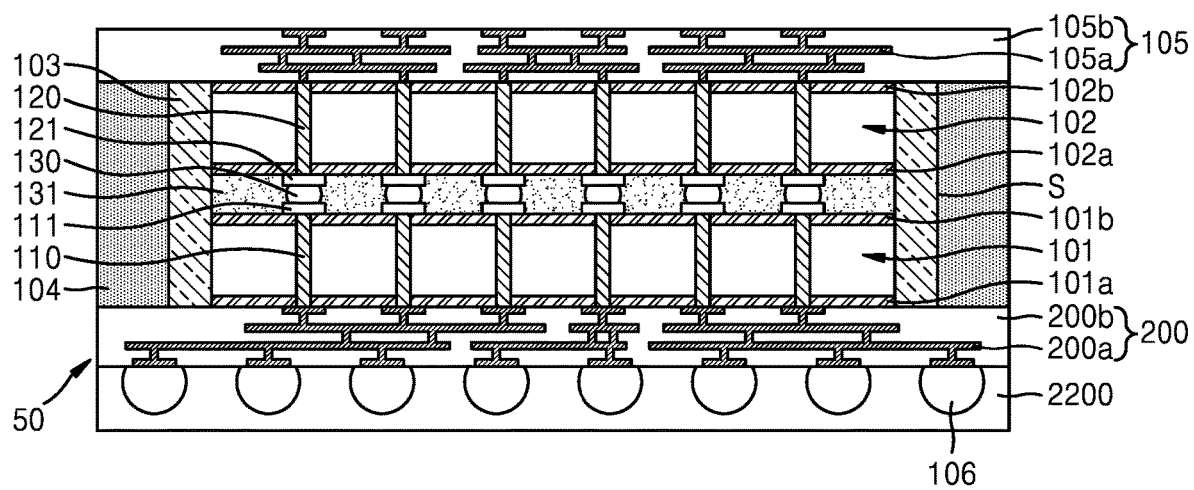

Referring to FIG. 22, the upper redistribution layer 105 may be formed on the second semiconductor device 102. In some embodiments, the formation of the upper redistribution layer 105 may include forming the upper redistribution pattern 105a and the upper insulation pattern 105b. The formation of the upper redistribution layer 105 may include forming a fourth protection substrate 2200 below the lower redistribution layer 200. The fourth protection substrate 2200 may serve to protect the lower redistribution layer 200 and the external connection terminal 106 from an external impact when the upper redistribution layer 105 is formed.

Figure 23:
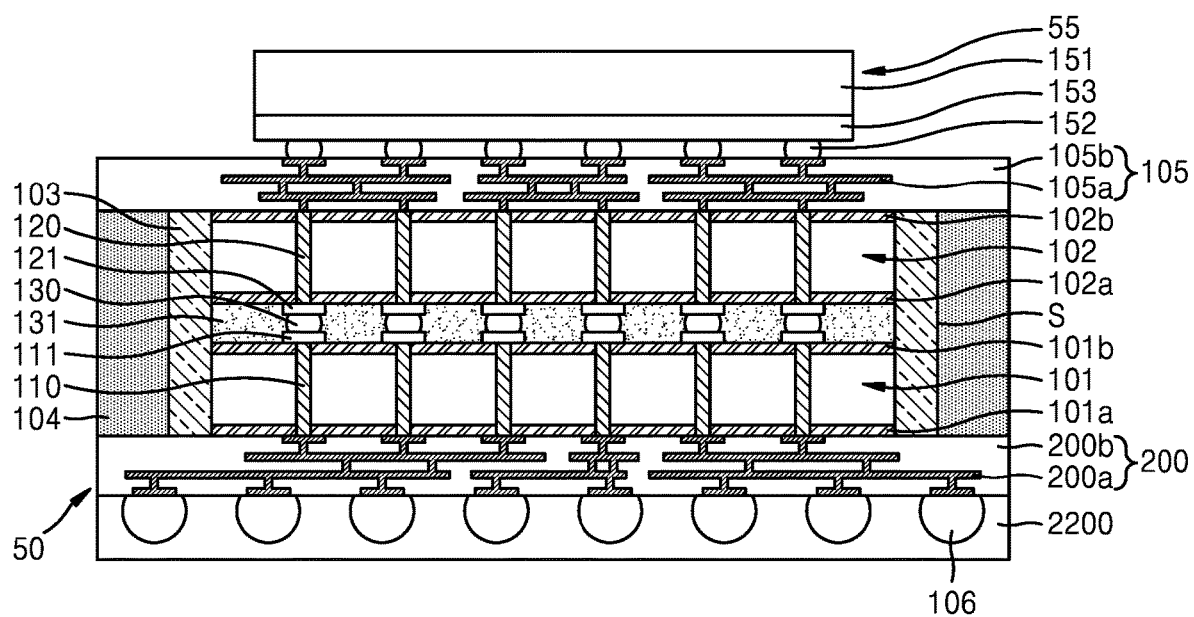

Referring to FIG. 23, the upper semiconductor package 55 may be mounted on the lower semiconductor package 50. In some embodiments, the mounting of the upper semiconductor package 55 on the lower semiconductor package 50 may include mounting the connection terminal 152 of the upper semiconductor package 55 on the upper redistribution layer 105 and electrically connecting the connection terminal 152 and the upper redistribution pattern 105a.

Figure 24:
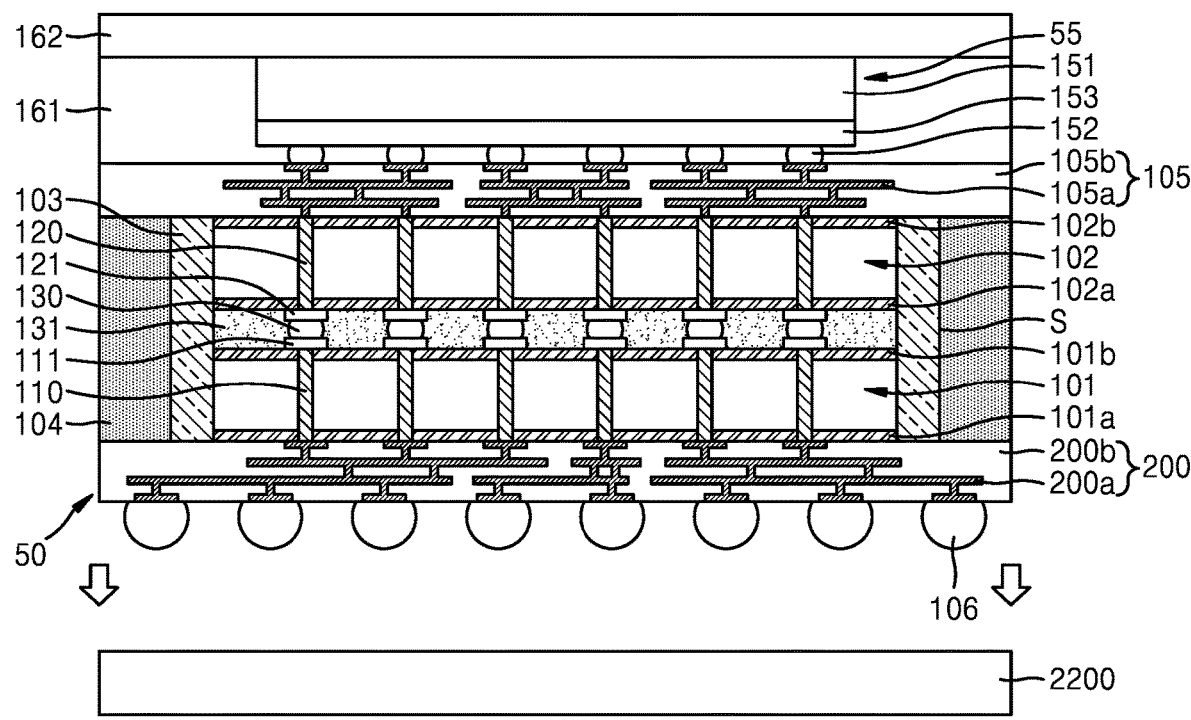

Referring to FIG. 24, the third molding member 161 and the heat sink 162 may be formed. In some embodiments, the third molding member 161 may be formed on the upper redistribution layer 105 to cover a sidewall of the third semiconductor device 151.

In some embodiments, the fourth protection substrate 2200 may be detached from the lower redistribution layer 200. The fourth protection substrate 2200 may be detached from the lower redistribution layer 200 after the third molding member 161 and the heat sink 162 are formed.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
a lower semiconductor package; and
an upper semiconductor package disposed on the lower semiconductor package,
wherein the lower semiconductor package includes:
a first semiconductor device including a first through electrode;
a second semiconductor device disposed on the first semiconductor device and including a second through electrode electrically connected to the first through electrode;
a first molding member covering a sidewall of at least one of the first semiconductor device and the second semiconductor device;
a second molding member contacting a sidewall of the first molding member; and
an upper redistribution layer disposed on the second semiconductor device and electrically connected to the second through electrode, and
wherein the upper semiconductor package includes:
a third semiconductor device; and a connection terminal electrically connected to the third semiconductor device and the upper redistribution layer.

2. The semiconductor package according to claim 1, wherein a material of the first molding member is different from a material of the second molding member.

3. The semiconductor package according to claim 1, wherein an upper surface of the second through electrode, an upper surface of the first molding member, and an upper surface of the second molding member are coplanar with one another.

4. The semiconductor package according to claim 1, wherein the lower semiconductor package further includes:
a first pad disposed on the first through electrode;
a second pad disposed under the second through electrode;
a connection bump disposed between the first pad and the second pad; and
a connection layer disposed between the first semiconductor device and the second semiconductor device and covering the first pad, the second pad, and the connection bump.

5. The semiconductor package according to claim 1, wherein a sidewall of the second semiconductor device is positioned further inward than a sidewall of the first semiconductor device,
the first molding member is disposed on the first semiconductor device and covers the second semiconductor device,
the sidewall of the first molding member is aligned with the sidewall of the first semiconductor device, and
the second molding member covers the sidewall of the first semiconductor device.

6. The semiconductor package according to claim 1, wherein the upper semiconductor package further includes:
a third molding member covering a sidewall of the third semiconductor device; and
a heat sink disposed on the third molding member, and
wherein a sidewall of the third molding member is aligned with a sidewall of the lower semiconductor package.

7. The semiconductor package according to claim 1, wherein the lower semiconductor package further includes:
a first protection layer disposed on the first semiconductor device and covering an upper portion of the first through electrode; and
a second protection layer disposed on the second semiconductor device and covering an upper portion of the second through electrode,
wherein an upper surface of the second protection layer is coplanar with an upper surface of the second through electrode.

8. A semiconductor package according comprising:
a lower package; and
an upper package disposed on the lower package,
wherein the lower package includes:
a first semiconductor device including a first through electrode;
a second semiconductor device disposed on the first semiconductor device and including a second through electrode electrically connected to the first through electrode;
a first molding member covering a sidewall of at least one of the first semiconductor device and the second semiconductor device;
a second molding member covering a sidewall of the first molding member;

an upper redistribution layer disposed on the second semiconductor device and electrically connected to the second through electrode;
a lower redistribution layer disposed below the first semiconductor device and electrically connected to the first through electrode; and
an external connection terminal electrically connected to the lower redistribution layer,
wherein the upper package includes:
a third semiconductor device; and
a first connection terminal electrically connected to the third semiconductor device and the upper redistribution layer, and
wherein an upper surface of the second through electrode is coplanar with a lower surface of the upper redistribution layer.

9. The semiconductor package according to claim 8, wherein each of the first and second molding members is free of a through electrode.

10. The semiconductor package according to claim 8, wherein the first molding member contacts the second molding member, and
a sidewall of the second molding member is aligned with a sidewall of the lower redistribution layer.

11. The semiconductor package according to claim 8, wherein a sidewall of the second semiconductor device is located further inward than a sidewall of the first semiconductor device,
the first molding member is disposed on the first semiconductor device and covers the sidewall of the second semiconductor device,
the sidewall of the first molding member is aligned with the sidewall of the first semiconductor device, and
the second molding member covers the sidewall of the first semiconductor device.

12. The semiconductor package according to claim 8, wherein the upper package further includes:
a third molding member that covers the third semiconductor device; and
a heat sink disposed on the third molding member and the third semiconductor device.

13. The semiconductor package according to claim 8, wherein a sidewall of the upper package is located further inward than a sidewall of the second molding member.

14. A semiconductor package comprising:
a first semiconductor device including a first through electrode;
a second semiconductor device disposed on the first semiconductor device and including a second through electrode electrically connected to the first through electrode;
a first molding member covering a sidewall of at least one of the first semiconductor device and the second semiconductor device, wherein the first molding member is spaced apart from all through electrodes;
an upper redistribution layer disposed on the second semiconductor device and including an upper redistribution pattern electrically connected to the second through electrode; and
a third semiconductor device disposed on the upper redistribution layer and electrically connected to the upper redistribution pattern.

15. The semiconductor package according to claim 14, further comprising:
a circuit substrate including an upper pad and a lower pad electrically connected to the upper pad; and an external connection terminal electrically connected to the lower pad.

16. The semiconductor package according to claim 15, further comprising a second molding member covering a sidewall of the first molding member and contacting the first molding member,
wherein a sidewall of the second molding member is aligned with a sidewall of the circuit substrate.

17. The semiconductor package according to claim 14, further comprising:
a lower redistribution layer disposed below the first semiconductor device and electrically connected to the first through electrode; and
an external terminal electrically connected to the lower redistribution layer.

18. The semiconductor package according to claim 14, further comprising:
a first pad disposed on the first through electrode;
a second pad disposed under the second through electrode;
a connection bump disposed between the first pad and the second pad; and
a connection layer disposed between the first semiconductor device and the second semiconductor device, and covering the first pad, the second pad, and the connection bump.

19. The semiconductor package according to claim 14, wherein a sidewall of the second semiconductor device is located further inward than a sidewall of the first semiconductor device,
the first molding member is disposed on the first semiconductor device and covering the sidewall of the second semiconductor device, and
the sidewall of the first molding member is aligned with the sidewall of the first semiconductor device.

20. The semiconductor package according to claim 8, wherein the upper redistribution layer comprises:
a redistribution pattern that is electrically connected to the second through electrode; and
an insulation region that is on the redistribution pattern, and
wherein an upper surface of the first molding member contacts only the insulation region of the upper redistribution layer.

* * * * *